United States Patent
Kim et al.

(10) Patent No.: US 7,580,313 B2
(45) Date of Patent: Aug. 25, 2009

(54) SEMICONDUCTOR MEMORY DEVICE FOR REDUCING CELL AREA

(75) Inventors: Dong-Keun Kim, Ichon-shi (KR); Jae-Jin Lee, Ichon-shi (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 0 days.

(21) Appl. No.: 11/589,038

(22) Filed: Oct. 30, 2006

(65) Prior Publication Data

US 2007/0041258 A1    Feb. 22, 2007

Related U.S. Application Data

(63) Continuation of application No. 11/017,683, filed on Dec. 22, 2004, now Pat. No. 7,139,211.

(30) Foreign Application Priority Data

May 6, 2004    (KR)    ............ 10-2004-0031916

(51) Int. Cl.
    *G11C 8/00* (2006.01)
(52) U.S. Cl. ............ 365/230.03; 365/230.06; 365/189.11; 365/189.011; 365/189.05; 365/205; 365/207; 365/185.11; 365/185.13
(58) Field of Classification Search ............ 365/207, 365/185.11, 185.05, 205, 189.011, 189.11, 365/189.05, 230.03, 230.06, 185.13
See application file for complete search history.

(56) References Cited

U.S. PATENT DOCUMENTS

| 5,586,078 | A | | 12/1996 | Takase et al. |
|---|---|---|---|---|
| 5,604,710 | A | | 2/1997 | Tomishima et al. |
| 5,838,627 | A | * | 11/1998 | Tomishima et al. ..... 365/230.03 |
| 5,943,285 | A | | 8/1999 | Kohno |
| 5,973,984 | A | | 10/1999 | Nagaoka |
| 6,150,728 | A | * | 11/2000 | Tsukude et al. ............. 257/786 |
| 6,370,079 | B1 | * | 4/2002 | Jung et al. ............. 365/230.06 |
| 6,538,941 | B2 | * | 3/2003 | Noh ............................ 365/203 |
| 6,721,198 | B2 | * | 4/2004 | Kang .......................... 365/145 |
| 6,806,582 | B2 | | 10/2004 | Ahn et al. |
| 6,832,177 | B2 | | 12/2004 | Khandekar et al. |
| 2004/0076039 | A1 | | 4/2004 | Chung et al. |
| 2004/0105317 | A1 | | 6/2004 | Shibata et al. |
| 2004/0140833 | A1 | | 7/2004 | Kim |

FOREIGN PATENT DOCUMENTS

JP    2004-139718 A    5/2004

\* cited by examiner

*Primary Examiner*—Anh Phung
*Assistant Examiner*—Eric Wendler
(74) *Attorney, Agent, or Firm*—Mannava & Kang, P.C.

(57) ABSTRACT

A semiconductor memory device with a reduced cell area and a high-speed data transfer by modifying a circuit layout. The semiconductor memory device includes: a cell area with a first and a second cell areas; a plurality of Y decoders of which one Y decoder selects bit line sense amplifiers in the first and the second cell areas; IO sense amplifiers provided with a first IO sense amplifier and a second IO sense amplifier; a plurality of first data lines for transferring a data sensed and amplified at the bit line sense amplifier of the first cell area; and a plurality of second data lines for transferring a data sensed and amplified at the bit line sense amplifier of the second cell area.

17 Claims, 4 Drawing Sheets

SEMICONDUCTOR MEMORY DEVICE FOR REDUCING CELL AREA

RELATED APPLICATION

This application is a continuation application of Ser. No. 11/017,683, filed Dec. 22, 2004 now U.S. Pat. No. 7,139,211, which claims priority of Republic of Korea Patent application No. 10-2004-0031916, filed May 6, 2004, and the contents of which are herewith incorporated by reference.

FIELD OF INVENTION

The present invention relates to a semiconductor memory device; and, more particularly, to a semiconductor memory device with an effective circuit layout for reducing a cell area.

DESCRIPTION OF PRIOR ART

As is well known, a semiconductor memory device is used for a data-storage media in order to store a lot of data. Thus, it is necessary for the semiconductor memory device to store the data in a minimized cell area rapidly and further, to access the stored data effectively.

Typically, the semiconductor memory device includes a plurality of cells arranged in a matrix shape to store the data where a plurality of word lines are disposed horizontally and a plurality of bit lines pass through the cells vertically. That is, the plurality of cells are allocated between intersections of the word lines and the bit lines. The reason that the cells are arranged in the matrix shape is beneficial to control a number of cells with ease and effectiveness.

Meanwhile, in order to select a specific word line among the plurality of word lines, a row address is inputted and decoded at a command decoder. Furthermore, a column address is inputted and decoded to select one bit line.

In recent years, however, a modern semiconductor memory device has been highly integrated to store a data of 1 Giga bytes or 4 Giga bytes. Therefore, a number of bit lines are disposed densely in a vertical direction and each of bit lines passes through the cells in parallel so that it is very difficult to select one bit line by decoding a column address despite of the memory cells arranged in the matrix shape.

For effectively decoding an external command inputted into the semiconductor memory device, a memory cell area is divided into a number of cell blocks, wherein each cell block is provided with a predetermined number of memory cells. In addition to the above, a data line that the data is transferred from a unit memory cell to a data input/output pad is classified into several lines, i.e., the bit line, a segment data input/output (IO) line, a local data IO line and a global IO line.

Besides the above, the prior art semiconductor memory device includes an input/output (IO) sense amplifier for amplifying a data signal which is disposed between the local data IO line and the global data IO line, in order to compensate loss of the data signal passing through the segment data IO line and the local data IO line, and to reliably transfer the data signal to the global data IO line with large loading capacitance.

FIG. 1 is a block diagram setting forth a prior art semiconductor memory device.

Referring to FIG. 1, the prior art semiconductor memory device includes a plurality of cell blocks, a plurality of bit line sense amplifying units, a plurality of Y decoders, a plurality of IO sense amplifiers IOSA, a plurality of write drivers WDRV, a plurality of data lines and a data input/output pad DQ PAD.

Herein, the prior art semiconductor memory device includes 16 cell blocks of which each cell block is provided with a predetermined number of memory cells. Each bit line sense amplifying unit corresponding to each cell block is provided with a plurality of bit line sense amplifiers in order to sense and amplify the data signal. Each Y decoder corresponding to each cell block selects one bit line among the plurality of bit lines after decoding an inputted column address. Each IO sense amplifier IOSA corresponding to each cell block transfers the output data signal to the data input/output pad DQ PAD. Each write driver WDRV corresponding to each cell block transfers an input data signal to the bit line sense amplifier through the data input/output pad DQ PAD. In order to provide a data input/output pathway, a plurality of segment data IO lines SIO, /SIO and a plurality of local data IO lines LIO, /LIO are disposed between the bit line sense amplifying unit and the IO sense amplifier IOSA.

FIG. 2 is a circuit diagram setting forth a data input/output pathway in the prior art semiconductor memory device depicted in FIG. 1.

Referring to FIG. 2, a bit line sense amplifying unit 20 includes a bit line sense amplifier 21 and a switching unit 22. The bit line sense amplifying unit 20 is used for sensing and amplifying a data signal applied to a bit line pair BL, /BL. The switching unit 22 performs a switching operation for outputting the data signal applied to the bit line pair BL, /BL to the segment data IO line by means of a decoded signal YI outputted from a Y decoder corresponding to a cell block.

In order to interconnect the segment data IO line SIO, /SIO to the local data IO line LIO, /LIO, it is necessary to interpose a connection unit 30 therebetween, for preventing an excessive loading capacitance at the local data IO line LIO, /LIO because a plurality of segment data IO lines SIO, /SIO are coupled to only one local data IO line LIO, /LIO. That is, each bit line sense amplifier of the bit line sense amplifying unit is connected to a respective segment data IO line SIO, /SIO. Then, the plurality of segment data IO lines SIO, /SIO are connected to only one local data IO line LIO, /LIO so that the connection unit 30 is required for preventing an excessive loading capacitance at the local data IO line LIO, /LIO.

Herein, a first and a second resistors R1, R2 and a first and a second capacitors C1, C2 denote parasitic resistors and parasitic capacitors generated at the segment data IO line SIO, /SIO, respectively. Moreover, a third and a fourth resistors R3, R4 and a third and a fourth capacitors C3, C4 represent parasitic resistors and parasitic capacitors generated at the local data IO line LIO, /LIO, respectively.

The data output pathway from the unit memory cell to the data input/output pad DQ PAD is illustrated in detail as follows. To begin with, the data stored in the unit cell is applied to the bit line. Then, the sense amplifier connected to the bit line detects a voltage difference between the bit line pair BL, /BL and amplifies the data signal. Thereafter, the amplified data signal is transferred to the IO sense amplifier IOSA through the segment data IO line SIO, /SIO and the local data IO line LIO, /LIO. Afterwards, the output data signal of the IO sense amplifier IOSA is transferred to the data input/output pad DQ PAD through a global data IO line GIO.

In case that a predetermined data is inputted though the data input/output pad DQ PAD from an exterior, a data input pathway is a reverse direction with respect to the data output pathway. Unlike the data output pathway, it is noted that the input data is transferred through the write driver WDRV to the bit line sense amplifier corresponding to the cell block.

In addition, the prior art semiconductor memory device further includes a data driver (not shown) corresponding to the data input/output pad DQ PAD for driving the data transferred to the global data IO line into an exterior.

Meanwhile, in order to input or output the data with high speed, a plurality of data is read or written from the cell block for a single data access. For example, four data are simultaneously read or written for the single data access and then, four data are outputted to the exterior sequentially after data-buffering operation, which is so called a 4-bit prefetch. That is, four decoded signals YI are outputted from the Y decoder to the cell block during the single data access command.

If the semiconductor memory device has ×16 mode and 4-bit prefetch operation, a predetermined operation for bring the data from the cell block and the data-buffering operation are needed. In this case, sixty four IO sense amplifiers are required for these operations. Accordingly, the prior art semiconductor memory device requires sixteen Y decoders provided that one Y decoder outputs four decoded signals YI simultaneously.

However, there is a limitation of a circuit area to implement 16 Y decoders en masse in the cell area so that the circuit area inevitably increases due to a number of Y decoders. To address the above problem, there is proposed a semiconductor memory device having cell blocks which are arranged in two rows.

FIG. 3 is a block diagram setting forth another prior art semiconductor memory device for overcoming the problem of the semiconductor memory device using eight Y decoders.

Referring to FIG. 3, a plurality of cell blocks are arranged in two rows and a Y decoder outputs a decoded signal to two cell blocks which are allocated in a same column. In this case, if the semiconductor memory device has ×16 mode and 4-bit pre-fetch operation, total 8 Y decoders are only needed. Therefore, it is possible to reduce the cell area in comparison with the prior art semiconductor memory device shown in FIG. 1.

However, another prior art semiconductor memory device has a shortcoming that the data pathway length of a cell block 1 is different from that of the cell block 9 after receiving the decoded signal of the Y decoder. In detail, a length of a local data IO line LIO2, /LIO2 which transfers the data of the cell block 9 is similar to the local data IO line of the prior art semiconductor memory device depicted in FIG. 1. On the other hand, a length of a local data IO line LIO1, /LIO1 which transfers the data of the cell block 1 to an IO sense amplifier 1 is inevitably lengthened because of a circuit layout. Therefore, a time that the data outputted from the cell block 1 is transferred to the IO sense amplifier 1 is different from a time that the data of the cell block 9 is transferred to the IO sense amplifier 2 due to a length difference between the local data IO line LIO1, /LIO1 and the local data line LIO2, /LIO2. As a result, data transfer time is increased. Further, as a loading capacitance becomes higher at the IO sense amplifier IOSA 1 corresponding to the cell block 1 than the IO sense amplifier 2 corresponding to the cell block 9, the operation time becomes delayed after all. Moreover, there is a drawback that the cell area is also increased because of the lengthened local data IO line in designing a circuit layout.

SUMMARY OF INVENTION

It is, therefore, an object of the present invention to provide a semiconductor memory device with decreased cell area and a high-speed data transfer by modifying a circuit layout.

In accordance with an aspect of the present invention, there is provided a semiconductor memory device including: a cell area including a first and a second cell areas, wherein each cell area is provided with a plurality of cell blocks and a plurality of bit line sense amplifying units; a plurality of Y decoders of which one Y decoder selects bit line sense amplifiers in the first cell area and the second cell area; an IO sense amplifying means including a plurality of first IO sense amplifiers and a plurality of second IO sense amplifiers, wherein the first IO sense amplifiers are disposed at one side of the cell area and the second IO sense amplifiers are disposed at the other side of the cell area; a plurality of first data lines for transferring a data sensed and amplified at the bit line sense amplifier of the first cell area; and a plurality of second data lines for transferring a data sensed and amplified at the bit line sense amplifier of the second cell area.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawing.

Figure 4:
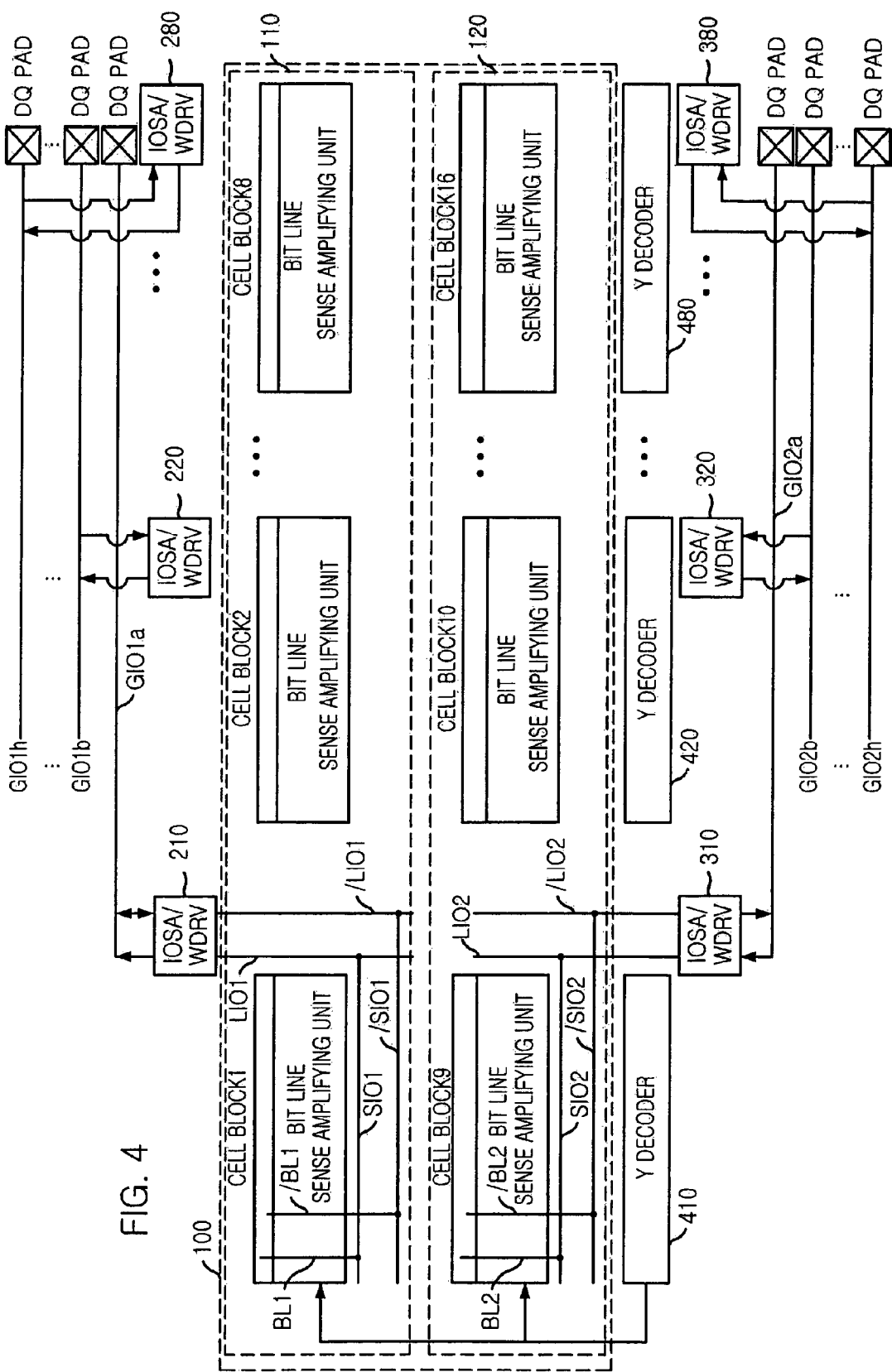
FIG. 4 is a block diagram setting forth a semiconductor memory device in accordance with a preferred embodiment of the present invention.

FIG. 4 is a block diagram setting forth a semiconductor memory device in accordance with a preferred embodiment of the present invention.

Referring to FIG. 4, the semiconductor memory device of the present invention includes a cell area 100, a plurality of Y decoders 410, 420, . . . 480, first IO sense amplifying units 210, 220, . . . 280 disposed at one side of the cell area 100, second IO sense amplifying units 310, 320, . . . and 380 disposed at the other side of the cell area 100, a plurality of first data lines and a plurality of second data lines. Herein, the cell area 100 is provided with a first cell area 110 and a second cell area 120, wherein each cell area has a plurality of cell blocks and a plurality of bit line sense amplifying units corresponding thereto. Each of the Y decoders 410, 420, . . . 480 selects a bit line sense amplifier of the bit line sense amplifying unit corresponding to the first cell area 110 as well as a bit line sense amplifier of the bit line sense amplifying unit corresponding to the second cell area 120, after decoding an inputted external command.

Each of the first data lines transfers the data sensed and amplified at the bit line sense amplifier of the first cell area 110 to the first IO sense amplifier 210, wherein the first data line has a local data IO line LIO1, /LIO1 and a segment data line SIO1, /SIO1. Each of the second data lines transfers the data sensed and amplified at the bit line sense amplifier of the second cell area 120 to the second IO sense amplifier 310, wherein the second data line has a local data IO line LIO2, /LIO2 and a segment data line SIO2, /SIO2.

Herein, the segment data IO lines SIO1, /SIO1, SIO2, /SIO2 are connected to the bit line sense amplifier of each cell area and the local data IO lines LIO, /LIO1, LIO2, /LIO2 are connected to the IO sense amplifiers 210, 310, wherein the segment data IO line SIO1, /SIO1, SIO2, /SIO2 and the local data IO line LIO, /LIO1, LIO2, /LIO2 are selectively connected through a switching unit (not shown).

The semiconductor memory device of the present invention further includes global data IO lines GIO connected to the first and the second IO sense amplifiers 210, 310 and a respective data input/output pad DQ PAD for outputting the data transferred through the global data IO lines GIO or transferring an inputted external data to the global data IO lines GIO. Herein, the data signals of the first IO sense amplifiers 210, 220 . . . 280 are transferred to first global data IO lines GIO1a, . . . GIO1h and the data signals of the second IO sense amplifier 310, 320 . . 380 are transferred to second global data IO lines GIO2a, . . . GIO2h. Though it is not shown in the drawing, in order to drive the data transferred to the global data IO lines to an exterior, the semiconductor memory device may further include a data driver corresponding to the data input/output pad DQ PAD.

A data pathway of the inventive semiconductor memory device will be illustrated in detail hereinafter.

Figure 1:
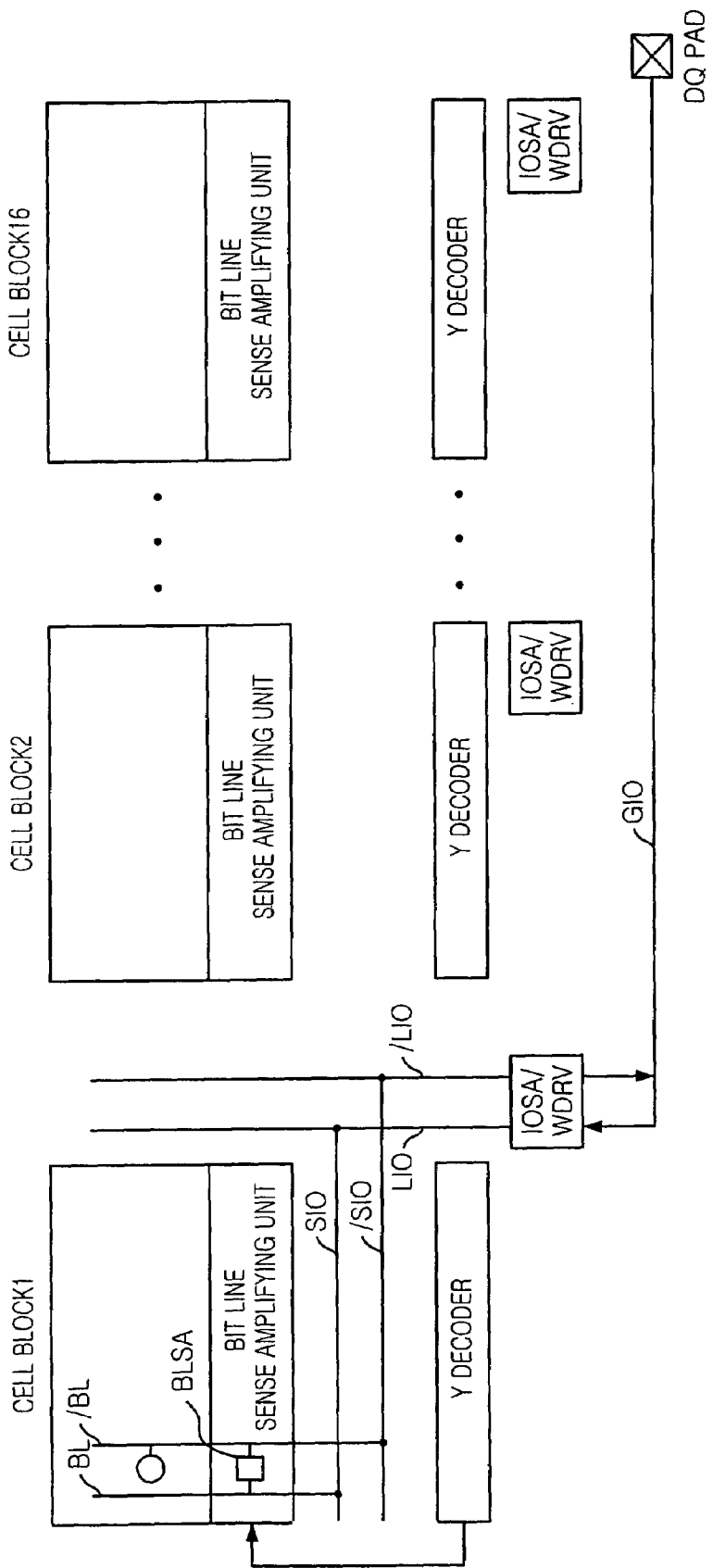
FIG. 1 is a block diagram setting forth a prior art semiconductor memory device.
Figure 2:
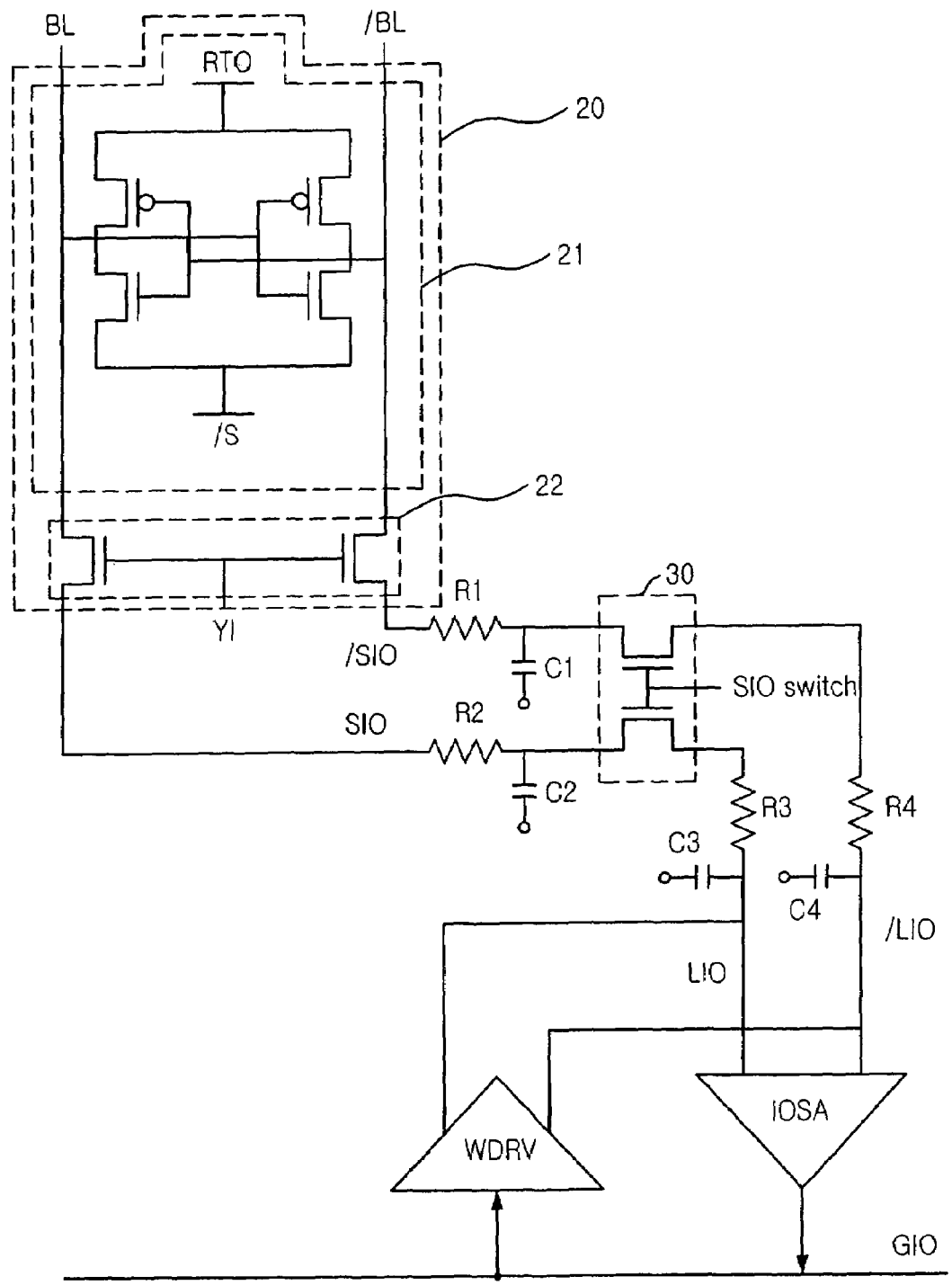
FIG. 2 is a circuit diagram setting forth a data input/output pathway of the prior art semiconductor memory device depicted in FIG. 1.

To begin with, referring to FIGS. 1 and 2, the data stored in the memory cell is applied to the bit line pair BL, /BL and then is transferred to the IO sense amplifier IOSA through the segment data IO line SIO, /SIO and the local data IO line LIO, /LIO after being amplified at the bit line sense amplifier. Thereafter, the IO sense amplifier transfers the data signal to the global data IO lines GIO after amplifying the data signal. Afterwards, the transferred data is outputted to an exterior through the data input/output pad DQ PAD. In case of inputting a data, the data input pathway is a reverse direction to the data output pathway. That is, the inputted data is transferred through the data input/output pad DQ PAD to the write driver WDRV.

In comparison with the prior art, the data sensed and amplified by the bit line sense amplifier of the first cell area 110 is transferred to the first IO sense amplifier 210 and the data sensed and amplified by the bit line sense amplifier of the second cell area 120 is transferred to the second IO sense amplifier 310. Herein, the first IO sense amplifier 210 is disposed at one side of the cell area 100 and the second IO sense amplifier 310 is disposed at the other side of the cell area 100. In other words, the first IO sense amplifier 210 is arranged symmetrically with respect to the second IO sense amplifier 310 for minimizing a length difference between the data pathway of the first cell area 110 and the data pathway of the second cell area 120. Therefore, the local data IO line LIO1, /LIO1 of the first cell area 110 is formed toward one side of the cell area 100 and the local data IO line LIO2, /LIO2 of the second cell area 120 is toward the other side of the cell area 100 for the purpose of minimizing the length difference.

Therefore, the length of the data pathway from the first cell area 110 to the IO sense amplifier IOSA is substantially equal to that of the data pathway from the second cell area 120 to the IO sense amplifier. Accordingly, a time delay between the data pathways of the first cell area and the second cell area does not occur so that it is possible to input or output the data with high-speed.

In addition, since the local data IO line LIO1, /LIO1 is not lengthened, the local data IO line LIO, /LIO1 is simply implemented in the circuit so as to reduce the cell area in comparison with the prior art semiconductor memory devices.

Figure 3:
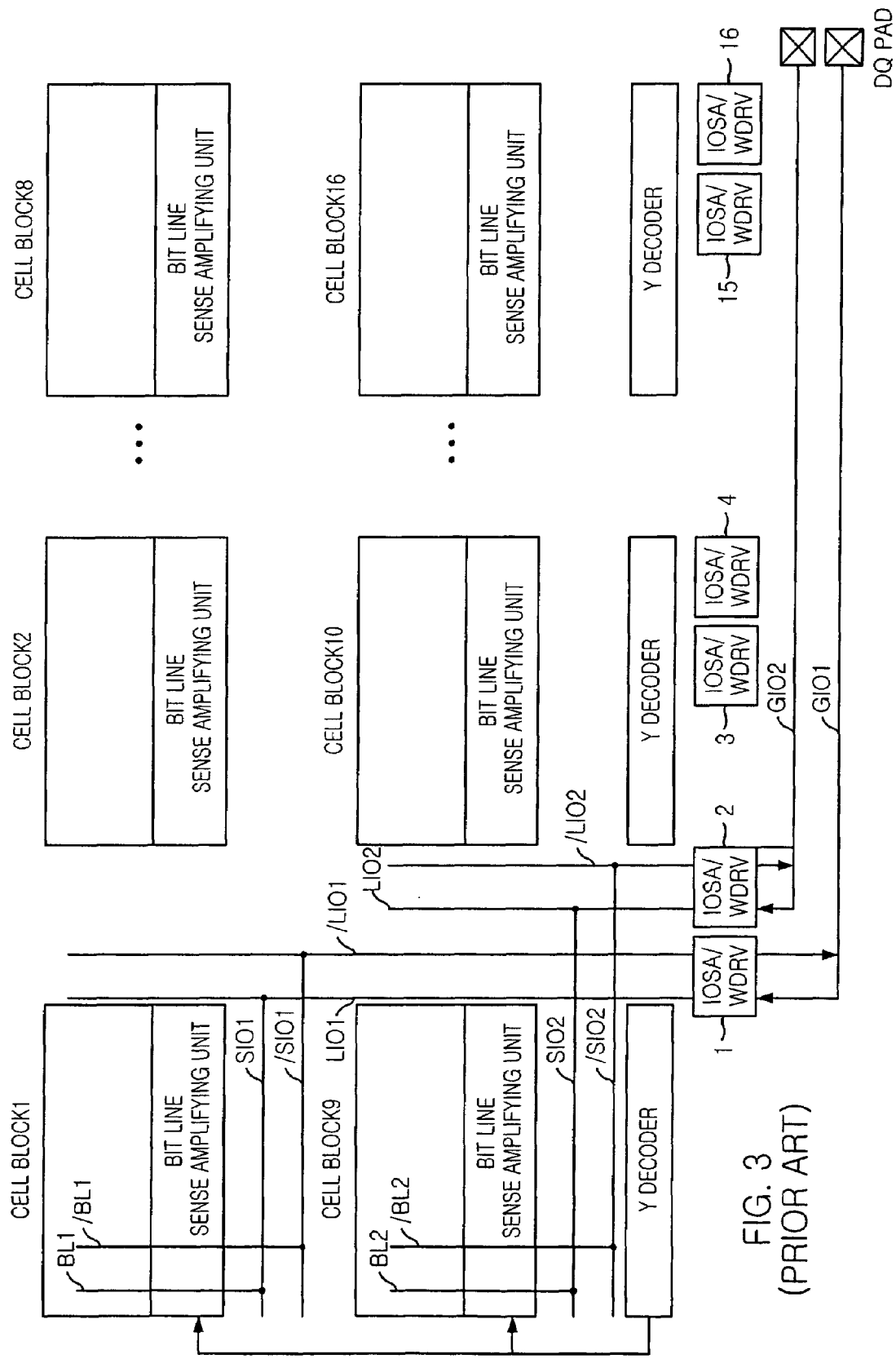
FIG. 3 is a block diagram setting forth another prior art semiconductor memory device.

In conclusion, though the inventive semiconductor memory device employs one Y decoder for simultaneously selecting the bit line amplifiers in two cell blocks like another semiconductor memory device shown in FIG. 3, the local data IO line LIO1, /LIO1 is not lengthened in comparison with the other local data IO line LIO2, /LIO2 by arranging a circuit layout optimally. Therefore, it is possible to secure a high-speed data input/output operation and to further effectively reduce the cell area.

The present application contains subject matter related to the Korean patent application No. KR 2004-31916, filed in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   plural cell areas formed in the semiconductor memory device;
   plural column decoders, each for decoding inputted command and address, wherein each column decoder controls a data access of each two cell areas;
   plural I/O sense amplifiers divided into two groups symmetrically formed in the semiconductor memory device, each corresponding to each cell area;
   a global data line of which one end is connected to a first I/O sense amplifier of the I/O sense amplifiers; and
   a data input/output pad for outputting a data transferred to the global data line or transferring an inputted data from an exterior to the global data line.

2. The semiconductor memory device as recited in claim 1, further comprising plural data lines, each for transferring a data sensed and amplified at each cell areas throughout each I/O sense amplifiers.

3. The semiconductor memory device as recited in claim 2, wherein lengths of the plural data lines are substantially same.

4. The semiconductor memory device as recited in claim 2, wherein each data line includes:
   a segment data line of which one end is connected to the bit line sense amplifier of the first cell area;
   a local data input/output line of which one end is connected to the first 10 sense amplifier; and
   a switching unit for selectively connecting the segment data line to the local data input/output line.

5. The semiconductor memory device as recited in claim 3, wherein two cell areas, two I/O sense amplifiers and two data lines are arranged in correspondence to one column decoder, wherein each of two cell areas, two I/O sense amplifiers and two data lines are respectively arranged symmetrically in a circuit with respect to each other, for minimizing a data pathway difference between the first data line and the second data line.

6. A semiconductor memory device, comprising:
   first and second cell areas symmetrically formed in the semiconductor memory device;
   a column decoder for decoding inputted command and address to access one of first and second cell area;
   first and second I/O sense amplifiers symmetrically formed in the semiconductor memory device;
   first and second data lines, each for transferring a data sensed and amplified at each of the first and second cell areas throughout each of the first and second I/O sense amplifiers;
   a global data line of which one end is connected to the first I/O sense amplifier; and
   a data input/output pad for outputting a data transferred to the global data line or transferring an inputted data from an exterior to the global data line.

7. The semiconductor memory device as recited in claim 6, wherein a length of the first data line is substantially equal to that of the second data line.

8. The semiconductor memory device as recited in claim 6, wherein each cell area is provided with a plurality of cell blocks and a plurality of bit line sense amplifying units.

9. The semiconductor memory device as recited in claim 6, wherein the first data line transfers a data sensed and amplified at the bit line sense amplifier of the first cell area throughout the first I/O sense amplifier and the second data line transfers a data sensed and amplified at the bit line sense amplifier of the second cell area throughout the second I/O sense amplifier.

10. The semiconductor memory device as recited in claim 6, wherein the first I/O sense amplifiers are disposed at one side of the first and second cell areas and the second I/O sense amplifiers are disposed at the other side of the first and second cell area.

11. The semiconductor memory device as recited in claim 6, wherein the first data line includes:
   a segment data line of which one end is connected to the bit line sense amplifier of the first cell area;
   a local data input/output line of which one end is connected to the first IO sense amplifier; and
   a switching unit for selectively connecting the segment data line to the local data input/output line.

12. The semiconductor memory device as recited in claim 6, wherein the second data line includes:
   a segment data line of which one end is connected to the bit line sense amplifier of the second cell area;
   a local data input/output line of which one end is connected to the second IO sense amplifier; and
   a switching unit for selectively connecting the segment data line to the local data input/output line.

13. The semiconductor memory device as recited in claim 7, wherein the first ell area, the first IO sense amplifiers and the first data lines are arranged symmetrically in a circuit with respect to the second cell area, the second IO sense amplifiers an the second data lines, for minimizing a data pathway difference between the first data line and the second data line.

14. The semiconductor memory device as recited in claim 8, wherein the column decoder selects plural bit line sense amplifiers in the first cell area and the second cell area.

15. A semiconductor memory device, comprising:
   first and second cell blocks;
   a column Y decoder which selects a bit line sense amplifier in the first and second cell blocks;
   a first data line for transferring a first data amplified at the bit line sense amplifier of the first cell block;
   a second data line for transferring a second data amplified at the bit line sense amplifier of the second cell block;
   first and second I/O sense amplifiers arranged symmetrically in a circuit with respect to each other;
   a global data line of which one end is connected to the first I/O sense amplifier; and
   a data input/output pad for outputting a data transferred to the global data line or transferring an inputted data from an exterior to the global data line,
   wherein the first data line is disposed in only first area including the first cell block and the second data line is disposed in only second area including the second cell block.

16. The semiconductor memory device as recited in claim 15, wherein lengths of the first and second data lines are substantially same.

17. The semiconductor memory device as recited in claim 16, wherein the first and second data lines are respectively arranged symmetrically in a circuit with respect to each other.

* * * * *